(12) United States Patent
Park et al.

(10) Patent No.: US 7,936,594 B2
(45) Date of Patent: May 3, 2011

(54) SEMICONDUCTOR MEMORY DEVICES HAVING CORE STRUCTURES FOR MULTI-WRITING

(75) Inventors: Joon Min Park, Seoul (KR); Beak Hyung Cho, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 58 days.

(21) Appl. No.: 12/437,438

(22) Filed: May 7, 2009

(65) Prior Publication Data
US 2009/0279351 A1 Nov. 12, 2009

(30) Foreign Application Priority Data

May 9, 2008 (KR) .................. 10-2008-0043109

(51) Int. Cl.
*G11C 11/00* (2006.01)
(52) U.S. Cl. .................................. 365/163; 365/185.24
(58) Field of Classification Search .................. 365/163, 365/185.24
See application file for complete search history.

(56) References Cited

U.S. PATENT DOCUMENTS

| 5,923,605 | A | 7/1999 | Mueller et al. |
| 6,643,175 | B2 * | 11/2003 | Yamauchi et al. ....... 365/185.11 |
| 6,788,600 | B2 | 9/2004 | Sugawara et al. |
| 7,027,342 | B2 | 4/2006 | Inoue |
| 2001/0050861 | A1 * | 12/2001 | Yamauchi et al. ....... 365/185.11 |
| 2002/0051383 | A1 * | 5/2002 | Mangan et al. .......... 365/185.11 |
| 2002/0163033 | A1 | 11/2002 | Sugawara et al. |
| 2005/0276138 | A1 | 12/2005 | Inoue |
| 2007/0286002 | A1 * | 12/2007 | Cowles et al. ................ 365/203 |

FOREIGN PATENT DOCUMENTS

| JP | 2006-79756 A | 3/2006 |
| KR | 1999-029329 A | 4/1999 |
| KR | 2003-0009118 A | 1/2003 |
| KR | 10-2006-0048368 A | 5/2006 |

* cited by examiner

*Primary Examiner* — Michael T Tran
(74) *Attorney, Agent, or Firm* — Myers Bigel Sibley & Sajovec, P.A.

(57) ABSTRACT

A semiconductor memory device having an efficient core structure for multi-writing includes a data input/output line, a plurality of memory banks each comprising a plurality of memory cells, a first global bit line and a second global bit line which are shared by the plurality of memory banks, and a first write driver and a second write driver which are connected with the data input/output line and provide a program current to the plurality of memory banks through the first and second global bit lines, respectively. Each memory bank includes a first cell area connected with the first global bit line and a second cell area connected with the second global bit line. In a multi-write mode, the first cell area in a first memory bank among the plurality of memory banks and the second cell area in a second memory bank among the plurality of memory banks are simultaneously selected and data is written to memory cells in the selected first and second cell areas, so that data writing time is reduced under the same conditions as a normal write mode.

20 Claims, 16 Drawing Sheets

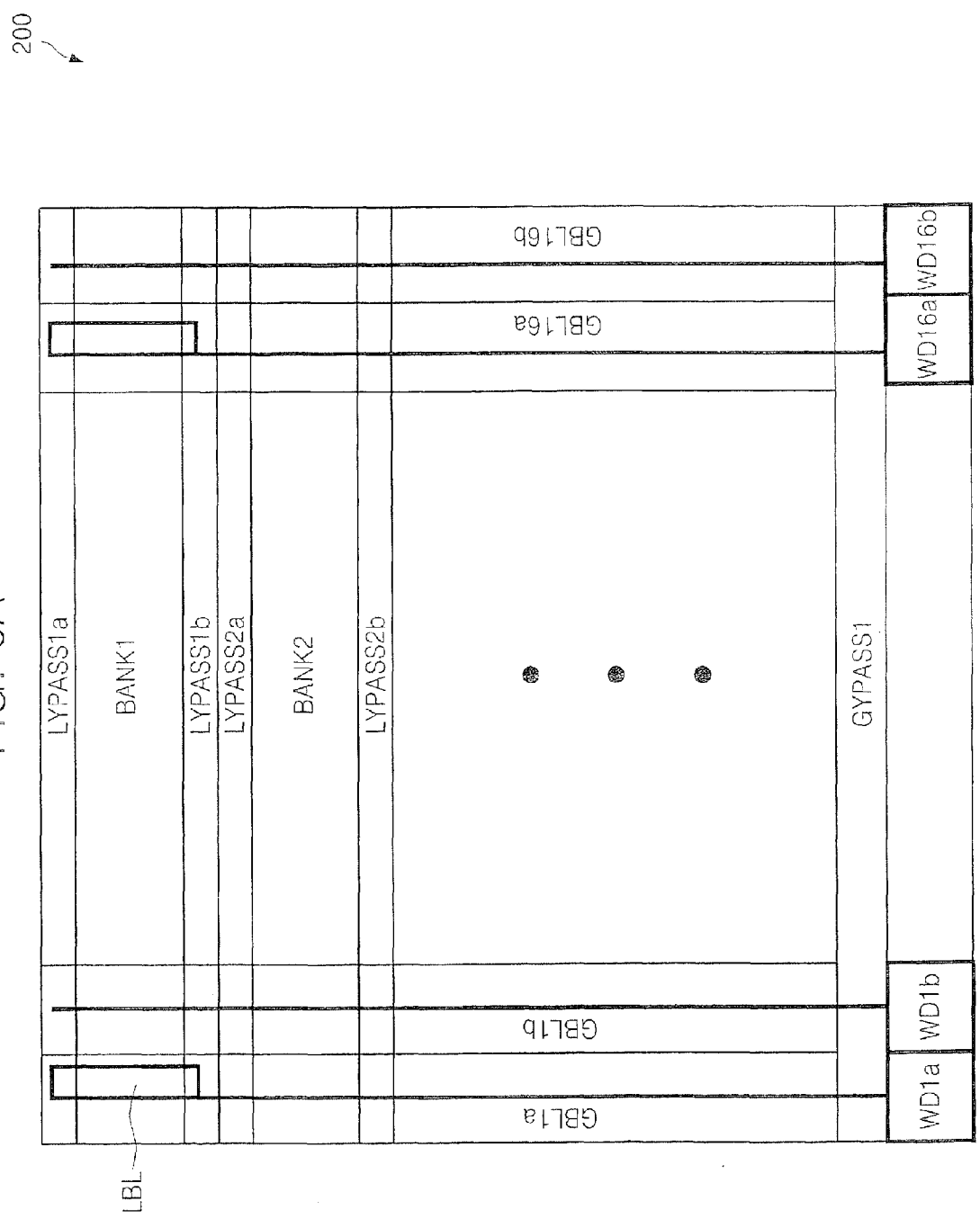

FIG. 7

| LY,LW DEC | MDEC | | | | | | | | | | | | | | | LY,LW DEC |
|---|---|---|---|---|---|---|---|---|---|---|---|---|---|---|---|---|
| | SWD | | | | | | | | | | | | | | | |
| | CJT | | CJT | | CJT | | CJT | | CJT | | CJT | | CJT | | CJT | |
| | LYPASS | SB 11a \| 11b | LYPASS | SB 12a \| 12b | LYPASS | SB 13a \| 13b | LYPASS | SB 14a \| 14b | LYPASS | SB 15a \| 15b | LYPASS | SB 16a \| 16b | LYPASS | SB 17a \| 17b | LYPASS | SB 18a \| 18b | LYPASS |
| | | SWD | | SWD | | SWD | | SWD | | SWD | | SWD | | SWD | | SWD | |
| | | CJT | | CJT | | CJT | | CJT | | CJT | | CJT | | CJT | | CJT | |
| LY,LW DEC | | | | | | | | | | | | | | | | LY,LW DEC |
| | | LYPASS | | LYPASS | | LYPASS | | LYPASS | | LYPASS | | LYPASS | | LYPASS | | LYPASS | |
| MDEC | SB 21a \| 21b | | SB 22a \| 22b | | SB 23a \| 23b | | SB 24a \| 24b | | SB 25a \| 25b | | SB 26a \| 26b | | SB 27a \| 27b | | SB 28a \| 28b | |
| | SWD | | SWD | | SWD | | SWD | | SWD | | SWD | | SWD | | SWD | |
| LY,LW DEC | | | | | | | | | | | | | | | | LY,LW DEC |

SEMICONDUCTOR MEMORY DEVICES HAVING CORE STRUCTURES FOR MULTI-WRITING

CROSS-REFERENCE TO RELATED APPLICATION

This application claims priority under 35 USC §119 to Korean Patent Application No. 10-2008-0043109, filed on May 9, 2008, the disclosure of which is hereby incorporated herein by reference in its entirety as if set forth fully herein.

BACKGROUND

The present invention relates to semiconductor memory devices, and more particularly, to phase-change semiconductor memory devices and operating methods therefor.

Semiconductor memory devices are widely used devices for storing data and may be largely divided into random access memory (RAM) and read-only memory (ROM). ROM is nonvolatile memory that can retain stored data even when not powered. Examples of ROM are programmable ROM (PROM), erasable PROM (EPROM), electrically EPROM (EEPROM), and flash memory. RAM is volatile memory where stored data is lost when power supply is interrupted. Examples of RAM are dynamic RAM (DRAM) and static RAM (SRAM). Moreover, semiconductor memory devices have been introduced that replace a capacitor with a non-volatile material in a DRAM-like architecture. Examples of these semiconductor memory devices are ferroelectric RAM devices using ferroelectric capacitors, magnetic RAM (MRAM) devices using tunneling magneto-resistive (TMR) films, and phase-change memory devices using chalcogenide alloys. The phase-change memory devices are non-volatile memory devices using phase change, i.e., resistance change over temperature.

FIG. 1 illustrates a memory cell 1 in a phase-change memory device. Referring to FIG. 1, the memory cell 1 includes a memory element 2 and a selection element 3. The memory element 2 is connected between a bit line BI, and the selection element 3. The selection element 3 is connected with the memory element 2, a ground, and a word line WL. Alternatively, the selection element 3 may be connected between the bit line BL and the memory element 2.

The memory element 2 includes a phase-change material. The phase-change material is a variable resistor whose resistance varies with temperature, such as Ge—Sb—Te. The phase-change material has one of two stable states, i.e., a crystal state and an amorphous state according to temperature. The phase-change material changes to the crystal state or the amorphous state according to current supplied through the bit line BL. The phase-change memory device can store data of "1" or "0" in the memory element 2 using this characteristic of the phase-change material.

FIG. 2 is a block diagram of a core structure in a phase-change memory device 10 according to an embodiment of the prior art. Referring to FIG. 2, the phase-change memory device 10 includes a memory cell array. The memory cell array may include a plurality of memory banks 10_1 through 10_16 each of which includes a plurality of phase-change memory cells arranged in a matrix form.

Sense amplifiers/write drivers (SA/WD) 30_1 through 30_16 are respectively disposed in the memory banks 10_1 through 10_16 to perform a read operation and a write operation. Global bit line selection circuits (GYPASS) 20_1 through 20_16 are respectively disposed in the memory banks 10_1 through 10_16. Each of the global bit line selection circuits 20_1 through 20_16 selectively connects a plurality of global bit lines GBL to a corresponding one of the sense amplifiers/write drivers 30_1 through 30_16. The phase-change memory device 10 also includes a local bit line selection circuit (not shown) to selectively connect a plurality of local bit lines (not shown) to one of the global bit lines GBL.

It will be understood that the block diagram of FIG. 2 and the remaining block diagrams herein provide an electrical schematic diagram illustrating the electrical interconnection of the various elements and, in some embodiments, may also illustrate the relative locations of these elements in a semiconductor memory device.

When the phase-change memory device 10 is tested, it may be desirable to write test data to a plurality of memory cells at the same time in order to reduce a testing time. Accordingly, it may be desirable to select two or more memory banks at one time.

When a phase-change memory device having the structure illustrated in FIG. 2, in which the sense amplifiers/write drivers 30_1 through 30_16 are respectively disposed in the memory banks 10_1 through 10_16, is tested, a plurality of memory banks can be selected at one time to write data thereto since the sense amplifiers/write drivers 30_1 through 30_16 are separately provided for the respective memory banks 10_1 through 10_16. Accordingly, with respect to the phase-change memory device 10 illustrated in FIG. 2, two or more memory banks (e.g., 10_1 and 10_2) among the memory banks 10_1 through 10_16 can be simultaneously selected for multi-writing, so that a testing time can be reduced.

In contrast, when a phase-change memory device having a structure, in which the plurality of the memory banks share sense amplifiers and write drivers, is tested, it may be difficult to select a plurality of memory banks at one time and write data thereto with a single write driver. If a plurality of memory banks are selected, data is written to memory cells in the plurality of memory banks through a single write driver. In a normal write operation, data is written to a single memory cell through a single write driver, and therefore, the write driver can make current having enough (e.g., desired) magnitude to write data flow to the memory cell. In a case of test in which a plurality of memory banks are selected and data is written to the memory banks with a single write driver, a mode has different conditions than a normal write mode.

SUMMARY

Some embodiments of the present invention provide semiconductor memory devices that can select a plurality of memory banks simultaneously for multi-writing when a global bit line is shared by the memory banks, which can thereby reduce a data writing time.

According to some embodiments of the present invention, there is provided a semiconductor memory device including a data input/output line, a plurality of memory banks each including a plurality of memory cells, a first global bit line and a second global bit line which are shared by the plurality of memory banks, and a first write driver and a second write driver which are connected with the data input/output line and provide a program current to the plurality of memory banks through the first and second global bit lines, respectively. Each of the memory banks includes a first cell area connected with the first global bit line and a second cell area connected with the second global bit line. In a normal write mode, either of the first or second cell areas is selected in one of the plurality of memory banks and data is written to a memory cell in the selected cell area. In a multi-write mode, the first cell area in a first memory bank among the plurality of memory banks and the second cell area in a second memory bank among the plurality of memory banks are simultaneously selected and data is written to memory cells in the selected first and second cell areas.

In the normal write mode, only one of the first or second write drivers is enabled and writes the data to the selected cell area through one of the first or second global bit lines. In the multi-write mode, the first write driver writes the data to the first cell area through the first global bit line and simultaneously the second write driver writes the data to the second cell area through the second global bit line.

According to other embodiments of the present invention, there is provided a semiconductor memory device including a plurality of data input/output lines, a plurality of memory banks each including a plurality of memory cells, a plurality of global bit lines shared by the plurality of memory banks, and a first write driver and a second write driver which are provided per one of the plurality of data input/output lines. Each of the memory banks includes a plurality of memory blocks corresponding to a predetermined number of data input/output lines, respectively, among the plurality of data input/output lines. Each of the memory blocks includes a first cell area to which data is written by the first write driver and a second cell area to which data is written by the second write driver. In a multi-write mode, a first memory bank and a second memory bank among the plurality of memory banks are simultaneously selected and one cell area among the first and second cell areas is selected with respect to a pair of the first and second write drivers in each of the first and second memory banks. In a normal write mode, only one memory bank among the plurality of memory banks is selected and the first or second cell area of each memory block is selected in the selected memory bank.

In the multi-write mode, the first cell area of each memory block in the first memory bank and the second cell area of each memory block in the second memory bank may be simultaneously selected or the second cell area of each memory block in the first memory bank and the first cell area of each memory block in the second memory bank may be simultaneously selected.

In the normal write mode, either of the first or second write drivers may be enabled. In the multi-write mode, both of the first and second write drivers may be enabled.

Embodiments of the present invention have been described above in connection with semiconductor memory devices themselves. However, other embodiments of the invention provide related methods of operating semiconductor memory devices and, more specifically, methods of writing data into semiconductor memory devices in a normal write mode and in a multi-write mode.

BRIEF DESCRIPTION OF THE DRAWINGS

The above and other features and advantages of the present invention will become more apparent by describing in detail exemplary embodiments thereof with reference to the attached drawings in which:

FIGS. 6A and 6B are diagrams for explaining operation of the memory device illustrated in FIGS. 5A and 5B in a normal write mode;

FIG. 7 is a detailed block diagram of a memory core structure according to some embodiments of the present invention;

DETAILED DESCRIPTION OF THE EMBODIMENTS

Figure 1:
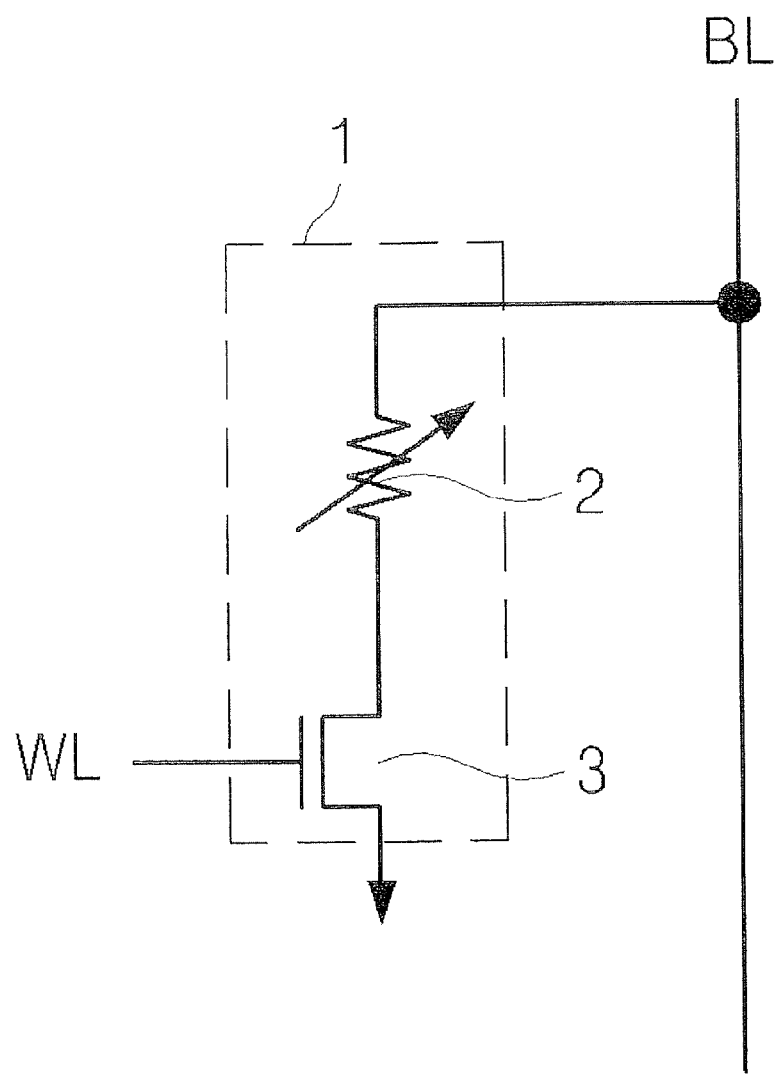
FIG. 1 is a circuit diagram of a memory cell in a typical phase-change memory device.
Figure 2:
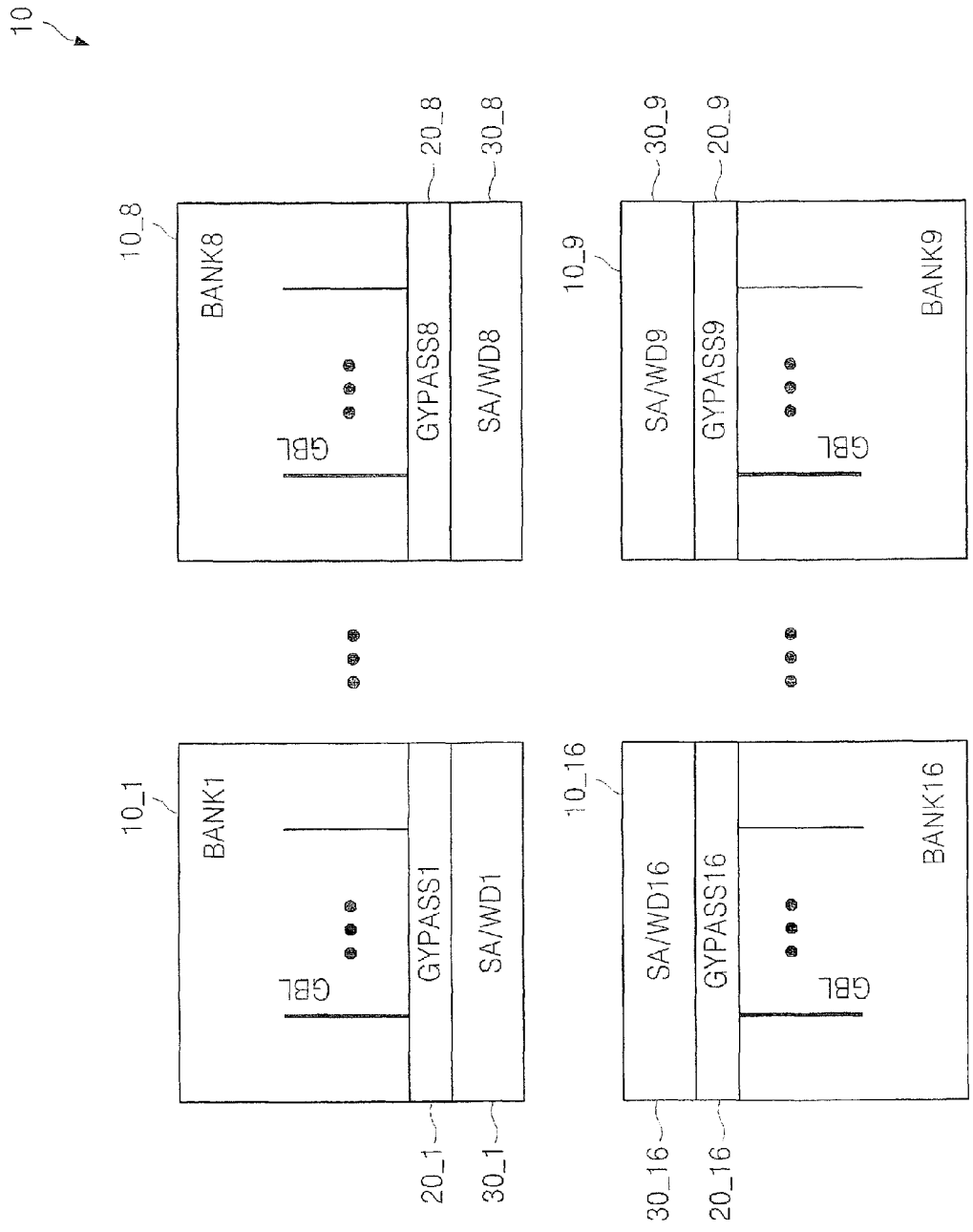
FIG. 2 is a block diagram of a core structure in a phase-change memory device according to an embodiment of the prior art.

As noted above, this application claims priority under 35 U.S.C. §119 to Korean Patent Application No. 10-2008-43109, filed on 9 May 2008, in the Korean Intellectual Property Office, the disclosure of which is incorporated herein by reference.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements and/or sections, these elements and/or sections should not be limited by these terms. These terms are only used to distinguish one element or section from another.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 3:
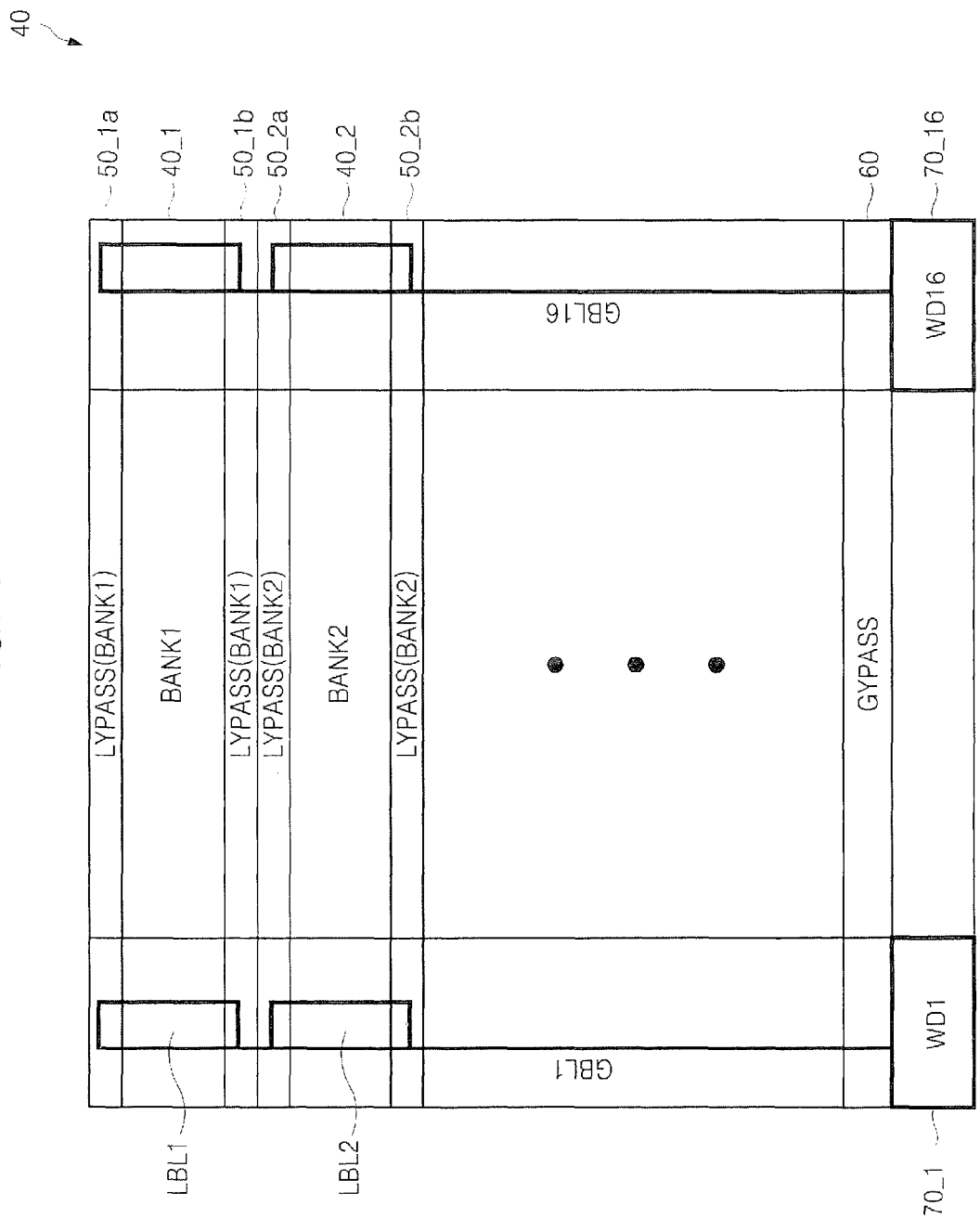
FIG. 3 is a block diagram of a core structure in a phase-change memory device according to a comparative embodiment of the present invention.

FIG. 3 is a block diagram of a core structure in a phase-change memory device 40 according to a comparative embodiment of the present invention. Referring to FIG. 3, the phase-change memory device 40 includes a memory cell array. The memory cell array may include a plurality of memory banks 40_1 and 40_2, each of which includes a plurality of phase-change memory cells arranged in a matrix form.

Each of a plurality of write drivers (WD) 70_1 and 70_16 and each of a plurality of global bit lines GBL1 and GBL16 are disposed to be shared by the plurality of the memory banks 40_1 and 40_2. A global bit line selection circuit 60 is also disposed to be shared by the memory banks 40_1 and 40_2 and selectively connects each of the global bit lines GBL1 and GBL16 to a corresponding one of the write drivers 70_1 and 70_16. The phase-change memory device 40 also includes local bit line selection circuits (LYPASS) 50_1a, 50_1b, 50_2a, and 50_2b to selectively connect a plurality of local bit lines LBL1 and LBL2 to one of the global bit lines GBL1 and GBL16.

When a phase-change memory device having a structure illustrated in FIG. 3, in which the plurality of the memory banks 40_1 and 40_2 share sense amplifiers (not shown) and the write drivers 70_1 and 70_16 through the global bit lines GBL1 and GBL16, is tested, it may be difficult to select a plurality of memory banks at one time and write data thereto with a single write driver. If a plurality of memory banks are selected, data is written to memory cells in the plurality of memory banks through a single write driver. In a normal write operation, data is written to a single memory cell through a single write driver, and therefore, the write driver can produce current having enough (e.g., desired) magnitude to write data flow to the memory cell. In a case of test in which a plurality of memory banks are selected and data is written to the memory banks with a single write driver, a test mode has different conditions than a normal write mode. In detail, in the normal write mode, cell current having desired magnitude is supplied to a single memory cell through a single write driver. When a plurality of memory banks are selected, the current is supplied to two or more memory cells through a single write driver and cell current less than in the normal write mode flows to each cell.

Various embodiments of the invention provide memory devices having a new core structure, in which a plurality of memory banks can be simultaneously selected for multi-writing when a global bit line is shared by the memory banks. In addition, in order to make test conditions similar to normal operation conditions, memory devices having a new core structure, in which multi-writing can be performed under conditions similar to those of a normal write mode may be provided, according to various embodiments of the invention.

Figure 4A:
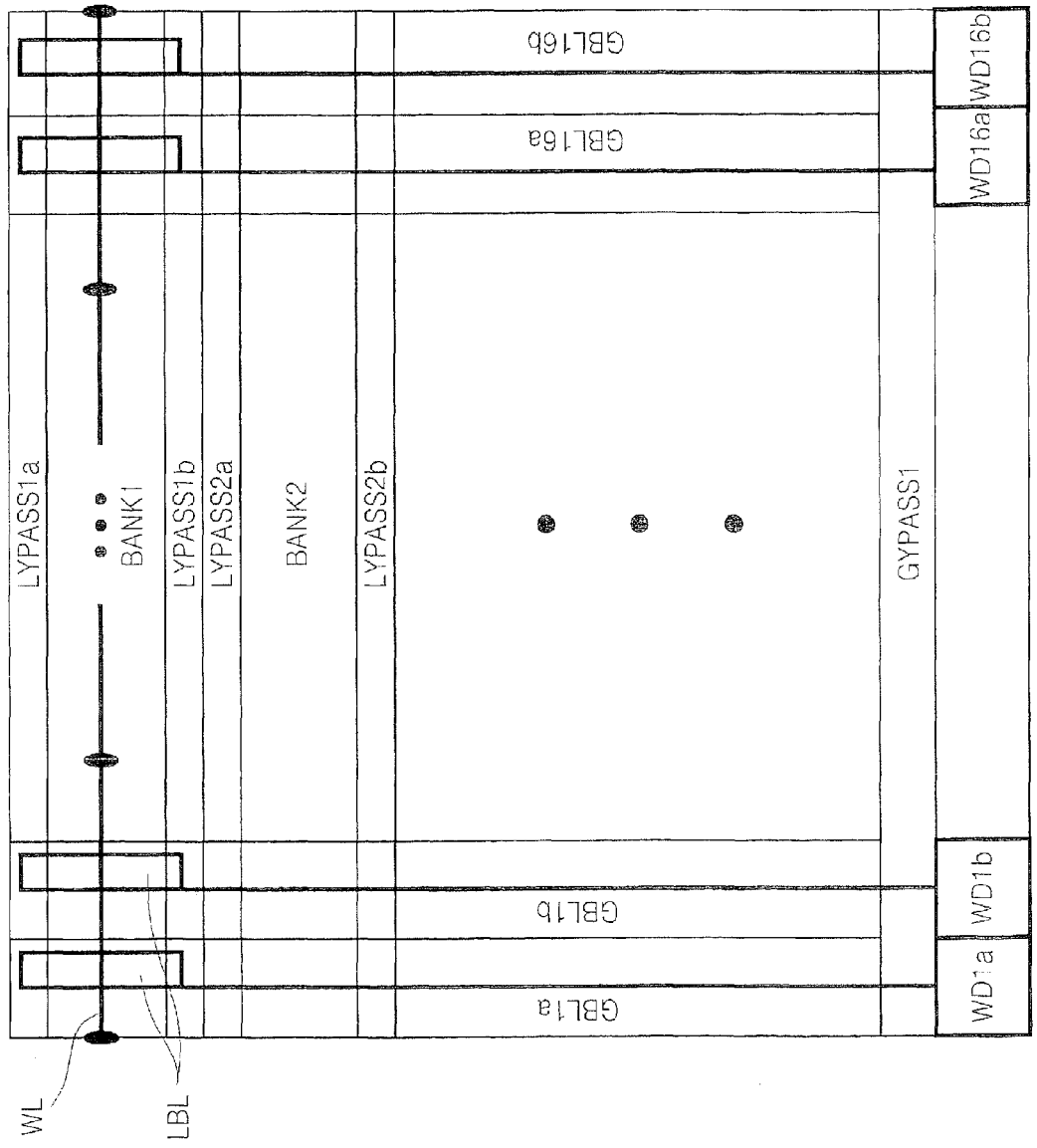
FIGS. 4A and 4B are block diagrams of a core structure in a memory device according to some embodiments of the present invention.

FIG. 4A is a block diagram of a core structure in a memory device 101 according to an embodiment of the present invention. Referring to FIG. 4A, the memory device 101 includes a memory cell array. The memory cell array may include a plurality of memory banks BANK1 and BANK2, each of which may include a plurality of phase-change memory cells arranged in a matrix form. The phase-change memory cells may be typical phase-change memory cells illustrated in FIG. 1, but the preset invention is not restricted thereto.

The memory device 101 includes a plurality of local bit line selection circuits LYPASS1a, LYPASS1b, LYPASS2a, and LYPASS2b disposed with respect to the memory banks BANK1 and BANK2; a plurality of global bit lines GBL1a, GBL1b, GBL16a, and GBL16b shared by the memory banks BANK1 and BANK2; and a plurality of write drivers WD1a, WD1b, WD16a, and WD16b shared by the memory banks BANK1 and BANK2 through the global bit lines GBL1a through GBL16b. Although not shown, the memory device 101 may further include an address decoder and a sense amplifier. The address decoder decodes an address input from an outside and selects a word line and a bit line. The address may be divided into a row address for selecting a word line and a column address for selecting a bit line. The bit line includes a global bit line GBL and a local bit line LBL. The sense amplifier is connected with a bit line to sense and amplify memory cell data. The number of memory banks may be 8 or 16, but the present invention is not restricted thereto.

In embodiments of the present invention according to FIG. 4A, two of the write drivers WD1a through WD16b are provided per one data input/output (I/O) line. For instance, the two write drivers WD1a and WD1b are provided for a first data I/O line (not shown) and the two write drivers WD16a and WD16b are provided for a sixteenth data I/O line (not shown).

Each of the memory banks BANK1 and BANK2 may be divided into a plurality of memory blocks. Each of the memory blocks may be a memory area corresponding to a single I/O line or a memory area corresponding to a predetermined number of (e.g., two) I/O lines. In embodiments of FIG. 4A, it is assumed that the number of I/O lines is 16, but the present invention is not restricted to this embodiment. When the number of I/O lines is 16, each of the memory banks BANK1 and BANK2 may be divided into 16 memory blocks, each of which is divided into two regions (hereinafter, referred to as sub-memory blocks) respectively assigned to two write drivers per one I/O line.

Each of the memory banks BANK1 and BANK2 is connected with a plurality of word lines WL and a plurality of the global bit lines GBL1a through GBL16b. Each memory cell (not shown) is connected with a word line WL and a local bit line LBL. The local bit line selection circuits LYPASS1a through LYPASS2b are connected between one of the global bit lines GBL1a through GBL16b and a plurality of local bit lines LBL to connect one of the local bit lines LBL, to the global bit lines GBL1a through GBL16b in response to local selection signals LYj (where j=1~n) shown in FIG. 12. Two of the local bit line selection circuits LYPASS1a through LYPASS2b may be disposed at the top and the bottom, respectively, of a corresponding one of the memory banks BANK1 and BANK2, and more specifically, at the top and the bottom, respectively, of each of memory blocks.

A global bit line selection circuit GYPASS1 connects one of the global bit lines GBL1a through GBL16b to a corresponding one of the write drivers WD1a through WD16b in response to a global selection signal. The structures and the operations of the local bit line selection circuits LYPASS1a through LYPASS2b and the global bit line selection circuit GYPASS1 will be described with reference to FIGS. 11 and 12 later.

Each of the write drivers WD1a through WD16b provides a program current to a selected global bit line (e.g., GBL1a). Each write driver (e.g., WD1a) provides a set current or a reset current to a global bit line (e.g., GBL1a) according to the input data. In embodiments of the present invention, the write drivers WD1a through WD16b may be disposed at the bottom of a group of memory banks, but the present invention is not restricted thereto.

In embodiments of FIG. 4A, two write drivers are allocated per one data I/O line, through which data is input or output, to write data to a memory bank. Since two write drivers are provided per one data I/O line, when a single memory bank is selected, data can be written to two memory cells per one I/O line at one time. An operation mode in which data is simultaneously written to two or more memory cells per one I/O line is referred to as a multi-write mode. In a normal write mode, a single memory cell is selected per one I/O line to write data.

Accordingly, in the embodiments of FIG. 4A, data can be written to twice as many memory cells in the multi-write mode than in the normal write mode. However, since twice as many memory cells are connected with a single word line in the multi-write mode, current flowing in one word line increases. In order to handle the increasing cell current, the size of a word line driver may need to be increased.

Figure 4B:
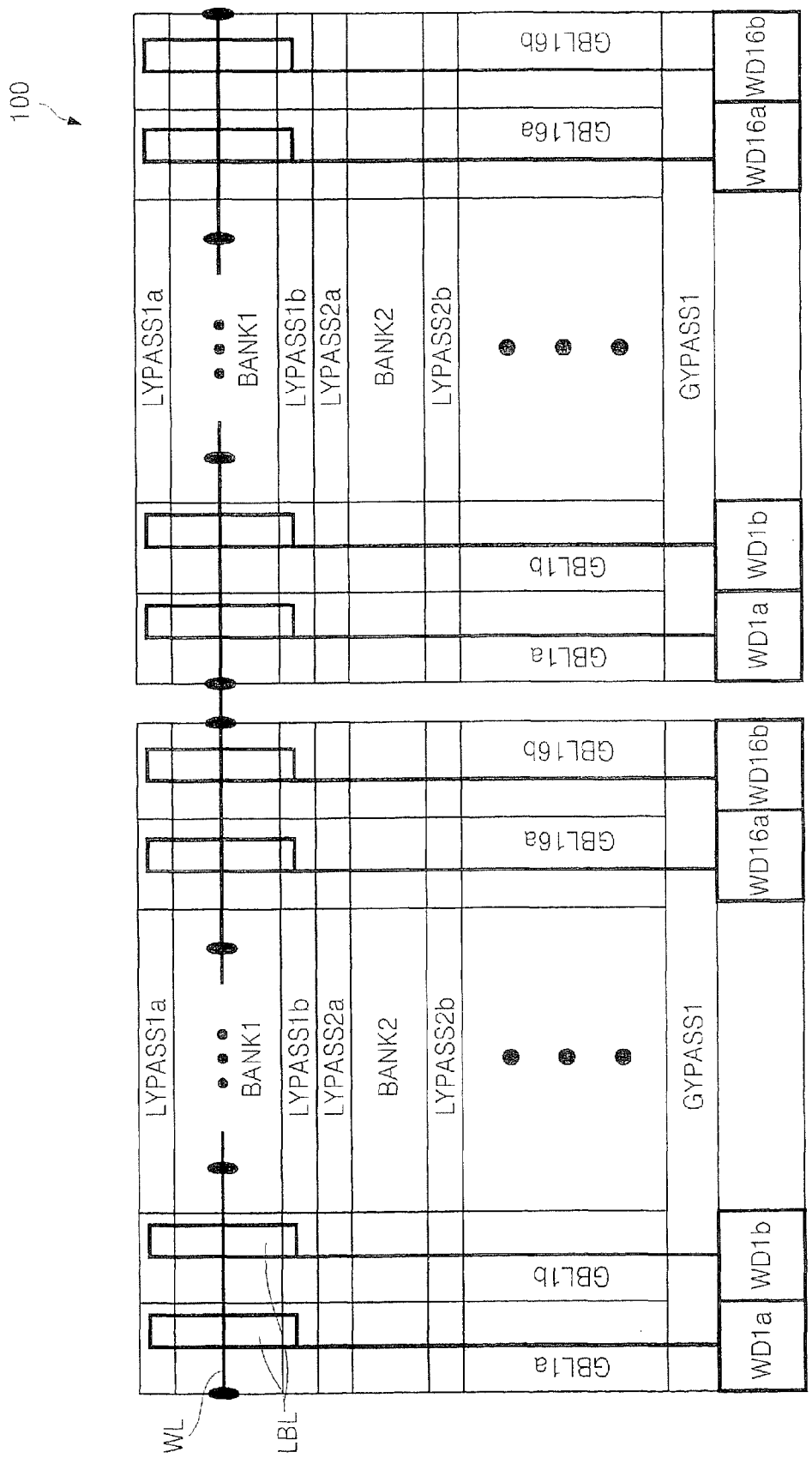

FIG. 4B is a block diagram of a core structure in a memory device 100 according to other embodiments of the present invention. The memory device 100 includes two memory mats. Each memory mat has the same core structure as the memory device 101 illustrated in FIG. 4A. In detail, each memory mat includes a plurality of the memory banks BANK1 and BANK2; a plurality of the local bit line selection circuits LYPASS1a, LYPASS1b, LYPASS2a, and LYPASS2b disposed with respect to the memory banks BANK1 and BANK2; a plurality of the global bit lines GBL1a, GBL1b, GBL16a, and GBL16b shared by the memory banks BANK1 and BANK2; and a plurality of the write drivers WD1a, WD1b, WD16a, and WD16b shared by the memory banks BANK1 and BANK2 through the global bit lines GBL1a through GBL16b. In the memory device 100 illustrated in FIG. 4B, word lines may be disposed to be connected between the two mats. Since all elements of the memory device 100 have been described with reference to FIG. 4A above, description thereof will be omitted.

Figure 5A:
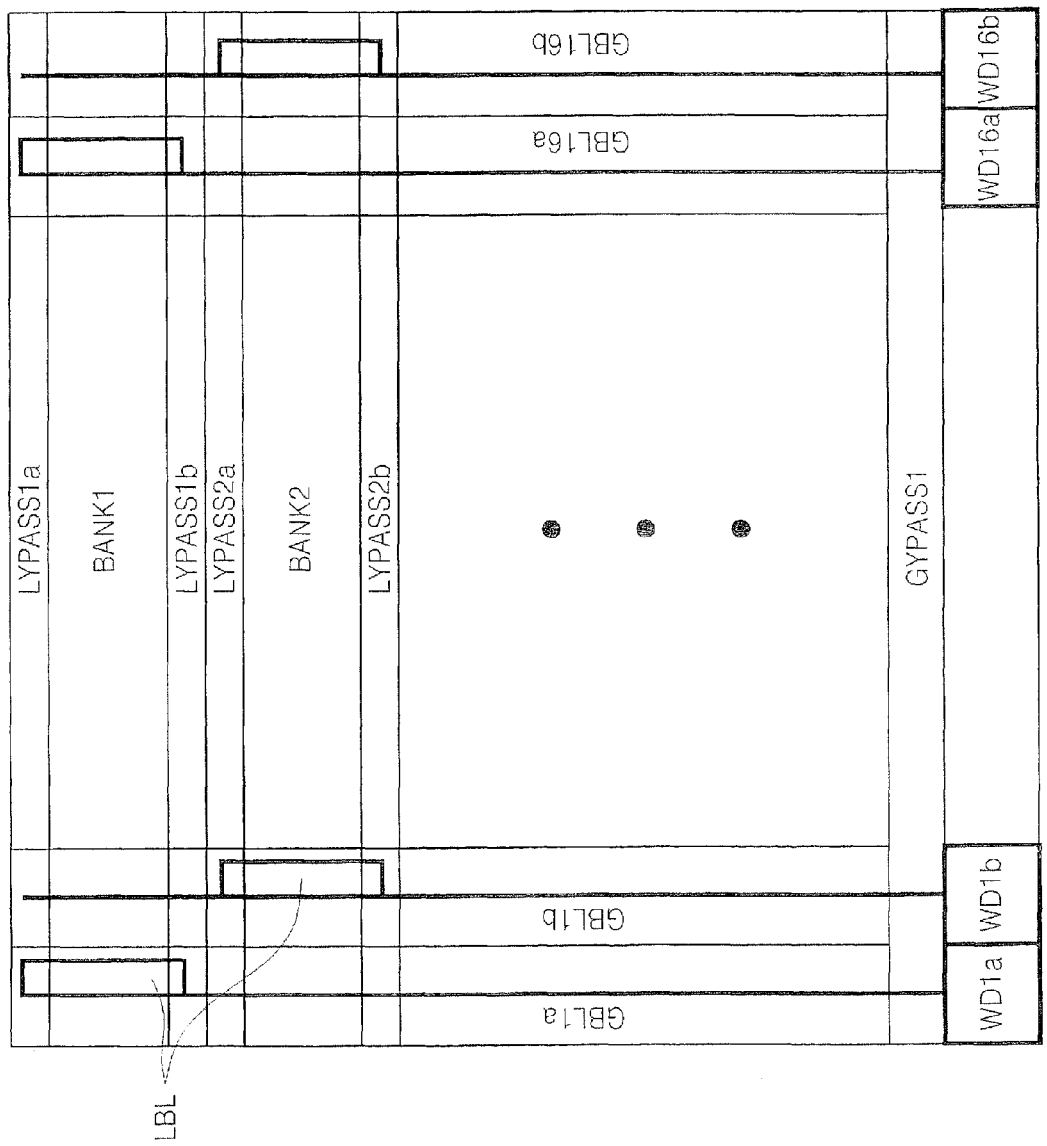
FIGS. 5A and 5B are block diagrams of a core structure in a memory device according to other embodiments of the present invention.
Figure 5B:
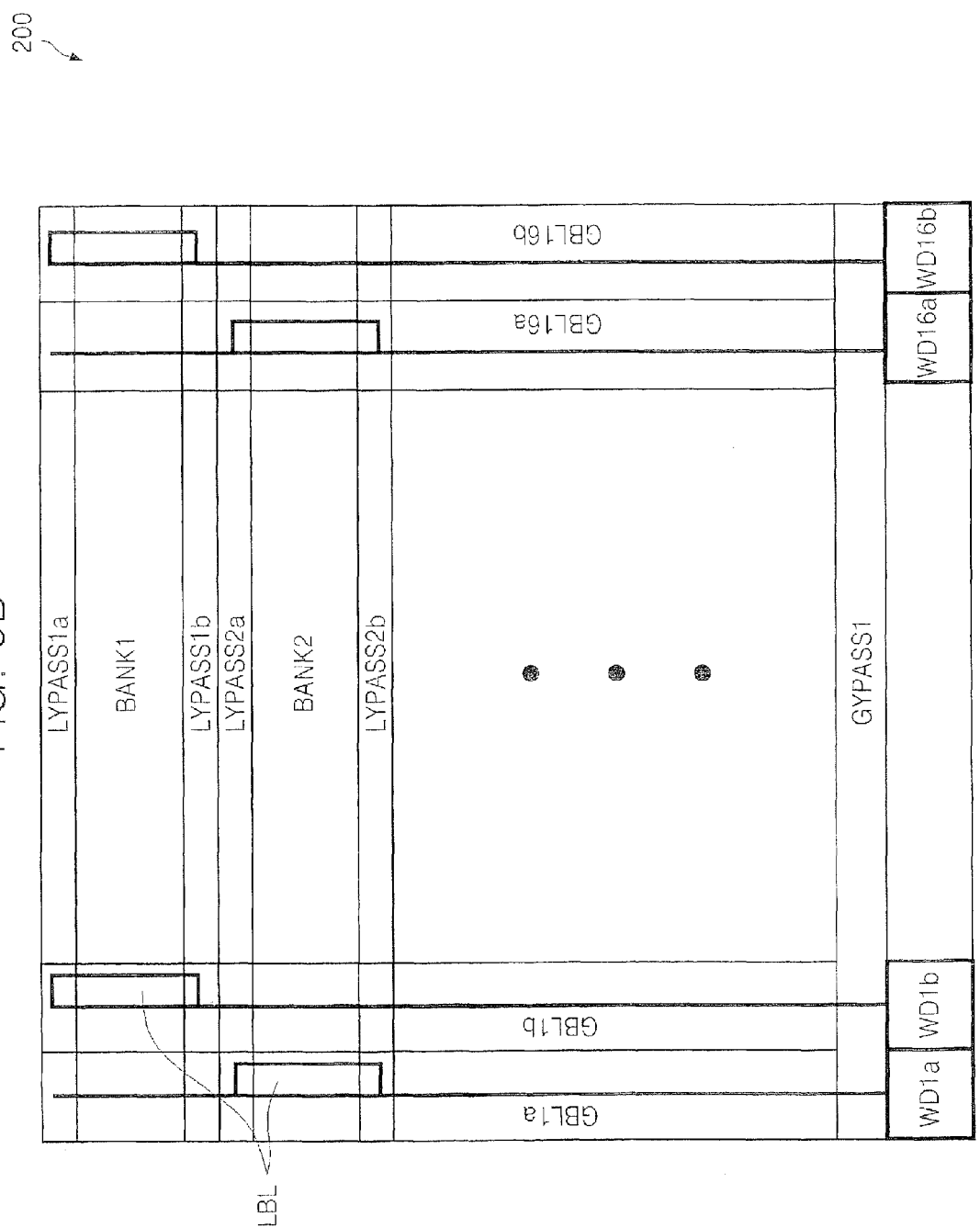

FIGS. 5A and 5B are block diagrams of a core structure in a memory device 200 according to other embodiments of the present invention. Referring to FIGS. 5A and 5B, the core structure of the memory device 200 is the same as that of the memory device 101 illustrated in FIG. 4A. In other words, the memory device 200 has the core structure in which a plurality of the memory banks BANK1 and BANK2 share the global bit lines GBL1a through GBL16b and share the write drivers WD1a through WD16b through the global bit lines GBL1a through GBL16b. Therefore, differences in the operation of memory device 200 from the memory device 101 will be described.

In the multi-write mode (e.g., a test mode), a plurality of (e.g., two) memory banks (e.g., the first memory bank BANK1 and the second memory bank BANK2) are selected simultaneously. At this time, in each selected memory bank, all sub-memory blocks are not selected, but only half of the sub-memory blocks may be selected so that a single memory cell is selected per one of the write drivers WD1a through WD16b.

For clarity of the description, a case where the first and second memory banks BANK1 and BANK2 are simultaneously selected in the multi-write mode will be described in detail. In the embodiments of FIGS. 5A and 5B, each of the memory banks BANK1 and BANK2 may be divided into a plurality of memory blocks corresponding to a single I/O line. Each of the memory blocks may be divided into two sub-memory blocks respectively assigned to two write drivers (i.e., the first and second write drivers WD1a and WD1b or WD16a and WD16b) per one I/O line. It is assumed that 16 I/O lines and 32 write drivers are provided, but the present invention is not restricted thereto.

In the multi-write mode of the memory device 200 having the above-described core structure, the first memory bank BANK1 and the second memory bank BANK2 are selected at the same time. At this time, a sub-memory block selected in the first memory bank BANK1 may not overlap a sub-memory block selected in the second memory bank BANK2. For instance, as illustrated in FIG. 5A, first, third, . . . , and thirty-first sub-memory blocks corresponding to the first write drivers WD1a through WD16a for respective I/O lines may be selected in the first memory bank BANK1 and second, fourth, . . . , and thirty-second sub-memory blocks corresponding to the second write drivers WD1b through WD16b for respective I/O lines may be selected in the second memory bank BANK2. Alternatively, as illustrated in FIG. 5B, the second, fourth, . . . , and thirty-second sub-memory blocks corresponding to the second write drivers WD1b through WD16b for the respective I/O lines may be selected in the first memory bank BANK1 and the first, third, . . . , and thirty-first sub-memory blocks corresponding to the first write drivers WD1a through WD16a for the respective I/O lines may be selected in the second memory bank BANK2.

As described above, although the first and second memory banks BANK1 and BANK2 are simultaneously selected, one area between a cell area corresponding to a first write driver of each I/O line (hereinafter, referred to as a first cell area) and a cell area corresponding to a second write driver of each I/O line is selected in the first memory bank BANK1 and the other area is selected in the second memory bank BANK2. Accordingly, the number of selected memory cells connected with a single word line is the same between the multi-write mode and the normal write mode. As a result, the number of memory cells selected on a single word line can be prevented from increasing twice in the multi-write mode as compared to the normal write mode.

Figure 6B:
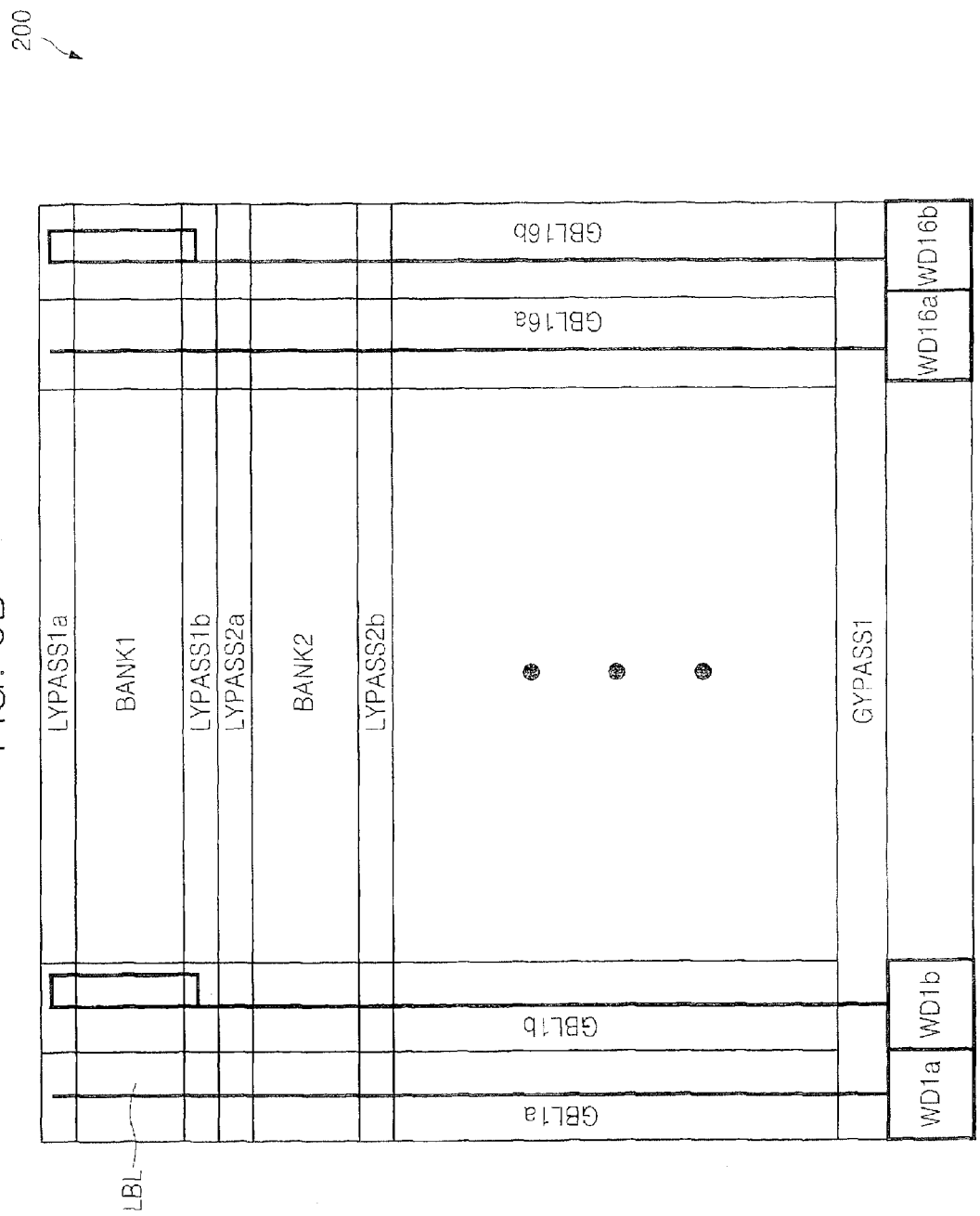

FIGS. 6A and 6B are block diagrams for explaining the operation of the memory device 200 illustrated in FIGS. 5A and 5B in the normal write mode. In the normal write mode of the memory device 200, only one memory bank is selected and only one write driver between first and second write drivers corresponding to a single I/O line is enabled. For instance, as illustrated in FIG. 6A, first cell areas, i.e., the first, third, . . . , and thirty-first sub-memory blocks corresponding to the first write drivers WD1a through WD16a of respective I/O lines may be selected in the first memory bank BANK1. Alternatively, as illustrated in FIG. 6B, second cell areas. i.e., the second, fourth, . . . , and thirty-second sub-memory blocks corresponding to the second write drivers WD1b through WD16b of respective I/O lines may be selected in the first memory bank BANK1.

As described above, in the normal write mode, only a write driver assigned to a sub-memory block including a memory cell to which data input through an I/O line will be written is enabled. Accordingly, based on address information of a memory cell to which data will be written, among two write drivers assigned to a single I/O line only a write driver assigned to a sub-memory block including the memory cell is selectively enabled.

As a result, in the normal write mode, only 16 write drivers among 32 write drivers are enabled and data is written to 16 memory cells selected in one selected memory bank (e.g., the first memory bank BANK1) through 16 global bit lines. In contrast, in the multi-write mode, the 32 write drivers are enabled and data is written to 16 selected memory cells in each of selected two memory banks (e.g., the first and second memory banks BANK1 and BANK2) through 32 global bit lines. Accordingly, with respect to a single memory bank, conditions are the same between the multi-write mode and the normal write mode. Thus, a write speed in the multi-write mode may be twice faster than a write speed in the normal write mode.

The memory device 200 may include two or more memory mats like the memory device 100 illustrated in FIG. 4B. Each memory mat has the same core structure and performs the same operation as that shown in FIG. 5A through 6B. Thus, detailed descriptions thereof will be omitted.

FIG. 7 is a detailed block diagram of a memory core structure according to some embodiments of the present invention. For clarity of the description, the structure of first and second memory banks is illustrated in FIG. 7 in detail.

Referring to FIG. 7, each of the first and second memory banks includes 8 memory blocks which may be divided into sub-memory blocks SB11a through SB18b and SB21a through SB28b. For instance, the first memory bank may be divided into 8 memory blocks each of which may be divided into two sub-memory blocks SB11a and SB11b, SB12a and SB12b, SB13a and SB13b, SB14a and SB14b, SB15a and SB15b, SB16a and SB16b, SB17a and SB17b, or SB11a and SB18b. Here, a single memory block is a memory area corresponding to one I/O line. Each of the sub-memory blocks SB11a, SB12a, . . . , SB18a, SB21a, SB22a, . . . , and SB28a having a reference character "a" corresponds to a first cell area corresponding to a first write driver of each I/O line. Each of the sub-memory blocks SB11b, SB12b, . . . , SB18b, SB21b, SB22b, . . . , and SB28b having a reference character "b" corresponding to a second cell area corresponds to a second write driver of each I/O line. Accordingly, first cell areas and second cell areas are alternately arranged in each memory bank.

In some embodiments, local word line drivers SWD may be disposed on the left and right sides, respectively, of each memory block and local bit line selection circuits LYPASS may be disposed at the top and bottom, respectively, of each memory block. In detail, a local word line driver SWD may be disposed between two adjacent memory blocks in one memory bank and two local bit line selection circuits LYPASS may be disposed between a memory block in the first memory bank and a corresponding memory block in the second memory bank. In addition, for each memory bank, a main word line decoder MDEC for decoding an address and selecting a main word line may be provided. A local bit line decoder LY DEC and a local word line decoder LW DEC may be disposed at each of the top and bottom of the main word line decoder MDEC. The local bit line decoder LY DEC and the local word line decoder LW DEC respectively generate a local bit line selection signal for selecting a local bit line and a local word line selection signal for selecting a local word line.

In addition, a local bit line selection signal driver and a local word line selection signal driver may be disposed in a conjunction area CJT. The local bit line selection signal driver transmits a local bit line selection signal (SIGI in FIGS. 9 and 11) generated by the local bit line decoder LY DEC to a local bit line selection circuit LYPASS and the local word line selection signal driver transmits a local word line selection signal generated by the local word line decoder LW DEC to a local word line driver SWD.

Figure 8:
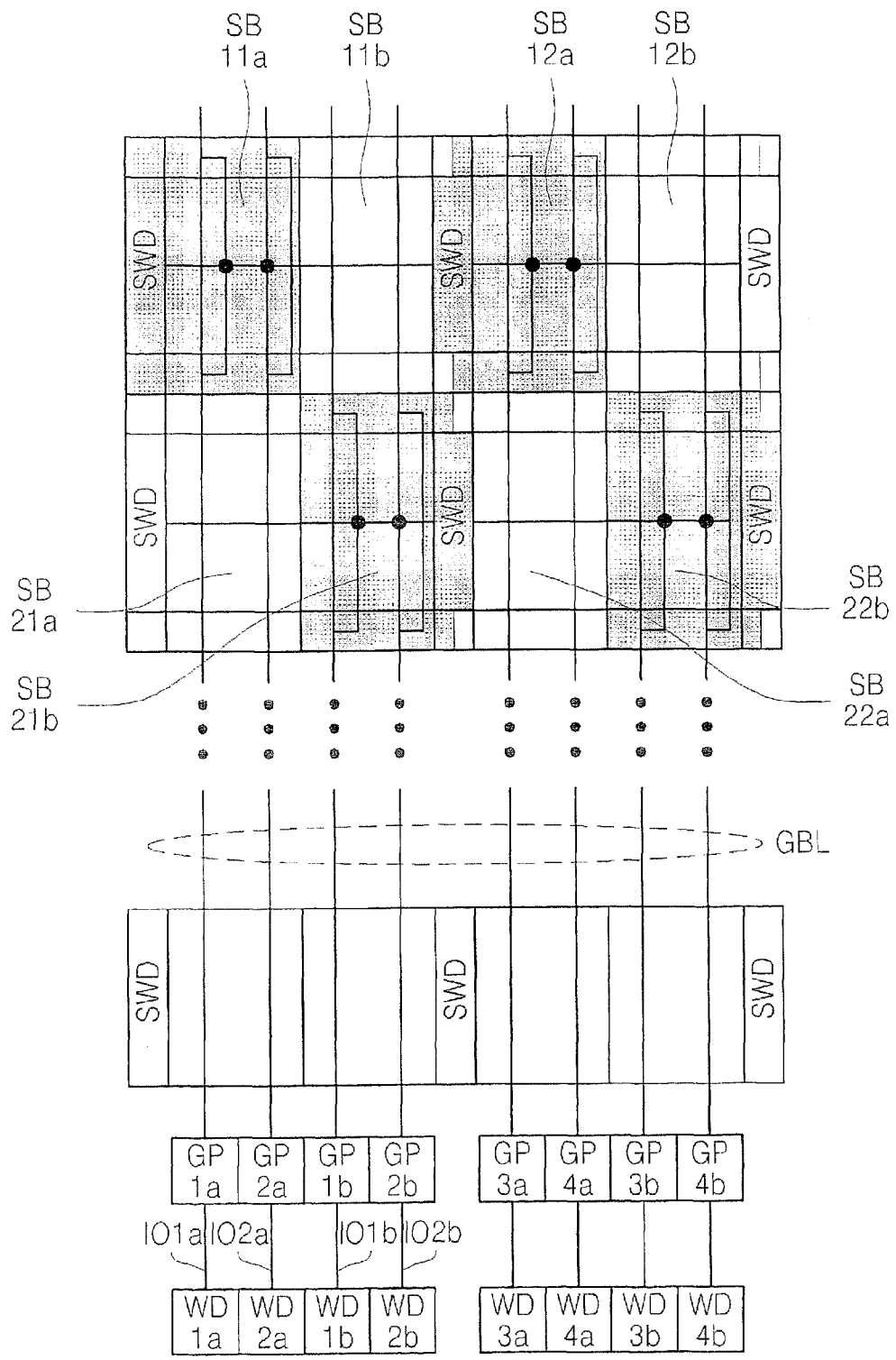
FIG. 8 is a block diagram of a core structure in a memory device according to other embodiments of the present invention.

FIG. 8 is a block diagram of a core structure in a memory device according to other embodiments of the present invention. For clarity of the description, 4 I/O lines and 2 write drivers per one I/O line, i.e., 8 write drivers WD1a, WD2a, . . . , WD4a, and WD4b are provide in the embodiments illustrated in FIG. 8, but the present invention is not restricted thereto. First and second memory banks illustrated in FIG. 8 have the same structure as the first and second memory banks illustrated in FIG. 7.

The operations of the memory device in the multi-write mode according to some embodiments of the present invention will be described with reference to FIG. 8. In the multi-write mode, the first and second memory banks are selected. First and third sub-memory blocks SB11a and SB12a corresponding to first cell areas may be selected in the first memory bank and second and fourth sub-memory blocks SB21b and SB22b corresponding to second cell areas may be selected in the second memory bank.

Although all of the 8 write drivers WD1a through WD4b are enabled, different cell areas may be selected in the first and second memory banks. For instance, first cell areas are selected in the first memory bank and second cell areas are selected in the second memory bank.

Figure 9:
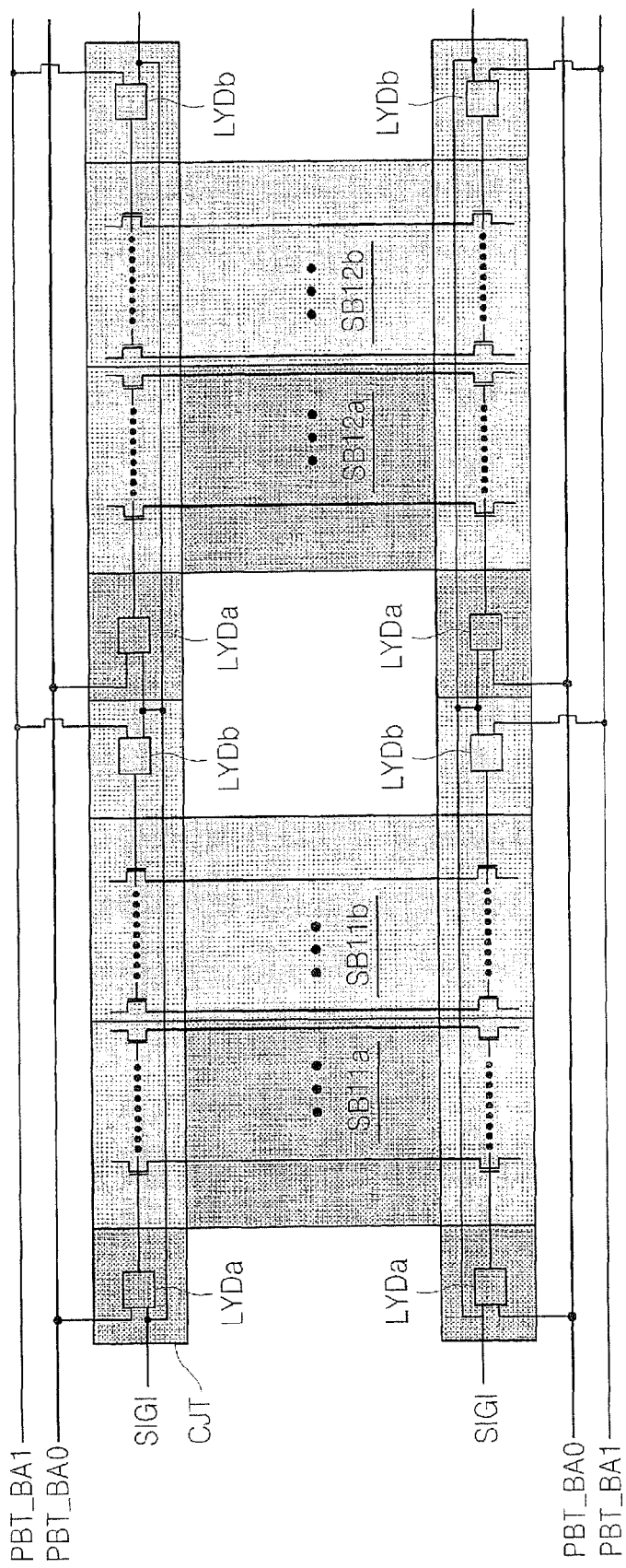
FIG. 9 is a detailed diagram of a part of the memory device illustrated in FIG. 8.

FIG. 9 is a detailed diagram of a part of the memory device illustrated in FIG. 8. Referring to FIGS. 8 and 9, a first local selection signal driver LYDa and/or a second local selection signal driver LYDb is disposed at each conjunction area CJT. In particular, in a conjunction area CJT adjacent two sub-memory blocks, local selection signal drivers respectively corresponding to the two sub-memory blocks, i.e., both of first and second local selection signal drivers LYDa and LYDb are disposed. The first and second local selection signal drivers LYDa and LYDb receive an address signal SIGI decoded by the local bit line decoder LY DEC and an area selection signal. Each of the first and second local selection signal drivers LYDa and LYDb performs an operation on the received signals to generate a local selection signal and transmits the local selection signal to a corresponding local bit line selection circuit LYPASS.

The area selection signal may include a first area selection signal PBT_BA0 and a second area selection signal PBT_BA1, which have complementary logic levels. The first local selection signal driver LYDa generates a first local selection signal based on the decoded address signal SIGI and the first area selection signal PBT_BA0 and the second local selection signal driver LYDb generates a second local selection signal based on the decoded address signal SIGI and the second area selection signal PBT_BA1.

The local bit line selection circuit LYPASS selectively connects one of local bit lines LBL of respective sub-memory blocks assigned to the local bit line selection circuit LYPASS to a global bit line GBL in response to the output signal of the first local selection signal driver LYDa. The local bit line selection circuit LYPASS also selectively connects one of the local bit lines LBL of the respective sub-memory blocks assigned to the local bit line selection circuit LYPASS to the global bit line GBL in response to the output signal of the second local selection signal driver LYDb.

Since the first and second cell areas SB11a through SB22b are alternately disposed in the memory banks, the first and second local selection signal drivers LYDa and LYDb may also be alternately disposed corresponding to the first and second cell areas SB11a through SB22b. For instance, first local selection signal drivers LYDa are disposed corresponding to the first and third sub-memory blocks SB11a and SB12a in the first memory bank and the second and fourth sub-memory blocks SB21b and SB22b in the second memory bank and second local selection signal drivers LYDb are disposed corresponding to the second and fourth sub-memory blocks SB11b and SB12b in the first memory bank and the first and third sub-memory blocks SB21a and SB22a in the second memory bank so that the first and third sub-memory blocks SB11a and SB12a corresponding to the first cell areas are selected in the first memory bank and the second and fourth sub-memory blocks SB21b and SB22b corresponding to the second cell areas are selected in the second memory bank.

The first and second area selection signals PBT_BA0 and PBT_BA1 have complementary logic level. Accordingly, when the first area selection signal PBT_BA0 is activated to a first level, cell areas corresponding to the first local selection signal drivers LYDa (hereinafter, referred to as a first selection area, e.g., the first cell areas in the first memory bank and the second cell areas in the second memory bank) are selected and one local bit line in each selected cell area is connected to the global bit line GBL. When the second area selection signal PBT_BA1 is activated to the first level, cell areas corresponding to the second local selection signal drivers LYDb (hereinafter, referred to as a second selection area, e.g., the second cell areas in the first memory bank and the first cell areas in the second memory bank) are selected and one local bit line in each selected cell area is connected to the global bit line GBL.

According to some embodiments of the present invention, in the multi-write mode, the first area selection signal PBT_BA0 is activated and the first selection area (e.g., the first cell areas in the first memory bank and the second cell areas in the second memory bank) is selected. After data is written to the first selection area, the second area selection signal PBT_BA1 is activated. Then, the second selection area (e.g., the second cell areas in the first memory bank and the first cell areas in the second memory bank) is selected and data is written to the second selection area. In the embodiments illustrated in FIGS. 8 and 9, two adjacent cell areas in one memory bank belong to different selection areas from each other.

Figure 10:
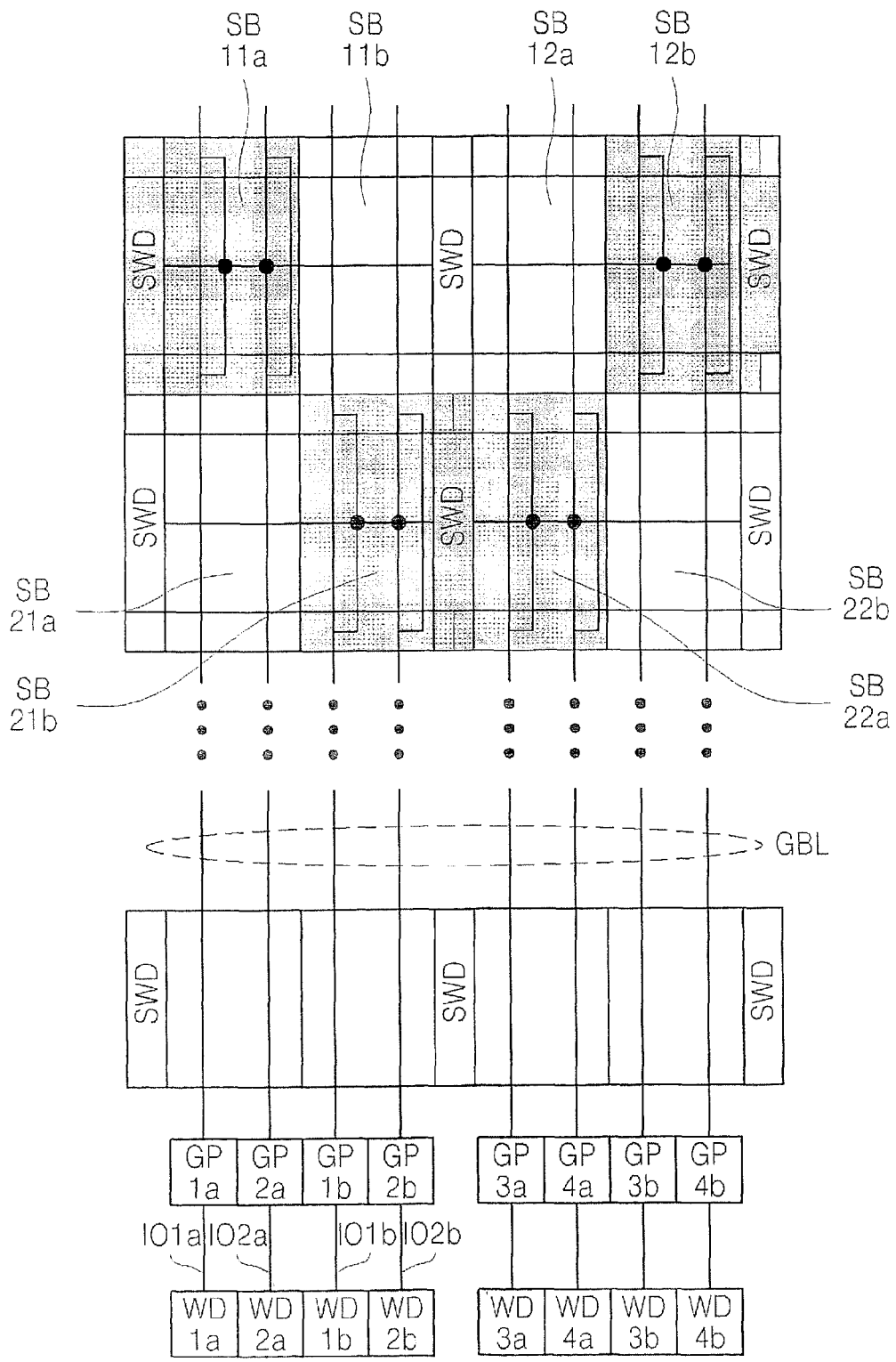
FIG. 10 is a block diagram of a core structure in a memory device according to further embodiments of the present invention.

FIG. 10 is a block diagram of a core structure in a memory device according to further embodiments of the present invention. The core structure illustrated in FIG. 10 is similar to that illustrated in FIG. 8. Thus, redundant descriptions will be omitted and differences will be described.

In the multi-write mode of the memory device illustrated in FIG. 10, first and second memory banks are selected and the first and fourth sub-memory blocks SB11a and SB12b in the first memory bank and the second and third sub-memory blocks SB21b and SB22a in the second memory bank are selected. All of the 8 write drivers WD1a through WD4b are enabled.

Figure 11:
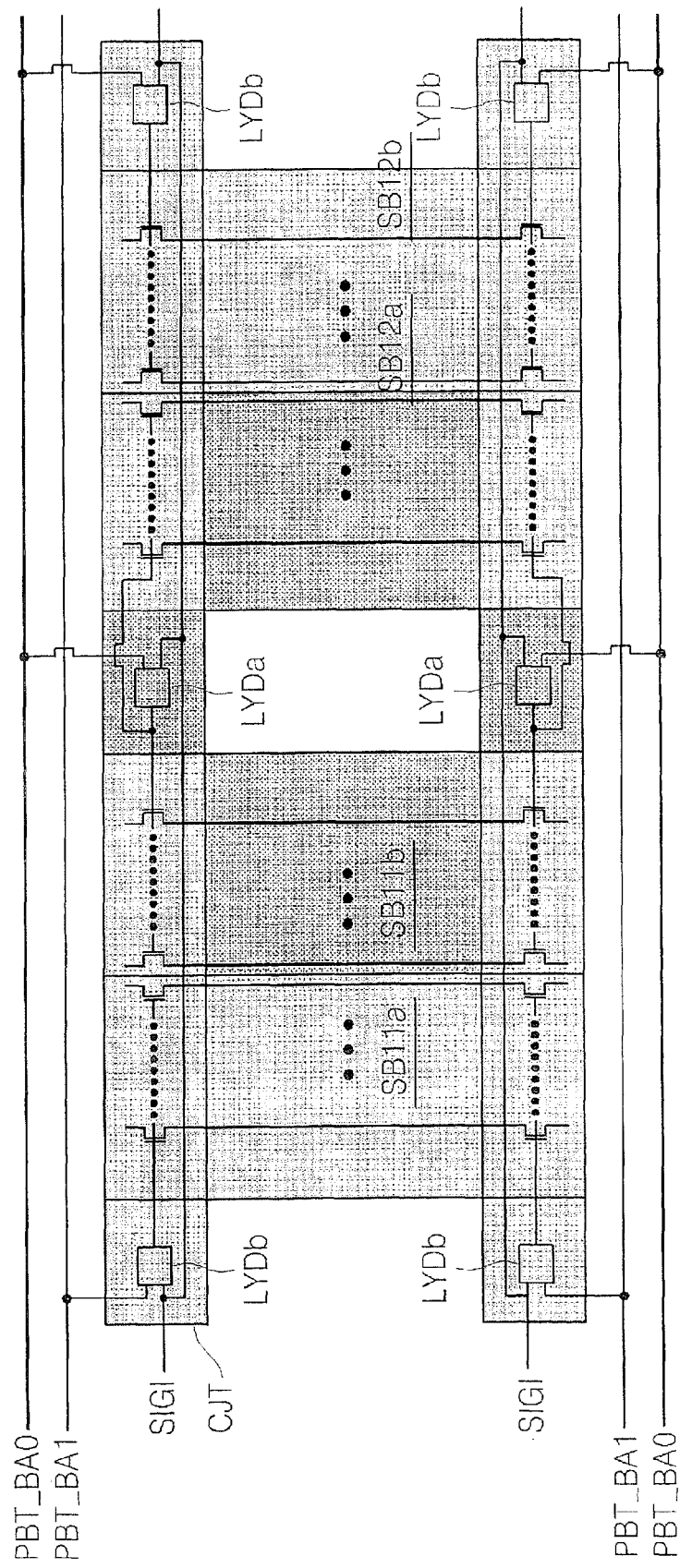
FIG. 11 is a detailed diagram of a part of the memory device illustrated in FIG. 10.

FIG. 11 is a detailed diagram of a part of the memory device illustrated in FIG. 10. The structure and the operation of the memory device illustrated in FIG. 11 are similar to those of the memory device illustrated in FIG. 9. Thus redundant descriptions will be omitted and differences will be described.

Referring to FIGS. 10 and 11, since two adjacent sub-memory blocks are selected in each memory bank, a single local selection signal driver LYDa or LYDb shared by two adjacent sub-memory blocks may be disposed at a conjunction area CJT so that the two adjacent sub-memory blocks are selected simultaneously. In other words, the single local selection signal driver LYDa or LYDb may be disposed to correspond to two adjacent sub-memory blocks.

In the embodiments illustrated in FIGS. 10 and 11, two adjacent cell areas (e.g., SB11b and SB12a or SB21b and SB22a) between adjacent memory blocks in each memory bank belong to one selection area. For instance, the two adjacent cell areas SB11b and SB12a in the first memory bank belong to the first selection area and the two adjacent cell areas SB21b and SB22a in the second memory bank belong to the second selection area.

In the embodiments illustrated in FIG. 11 since two adjacent sub-memory blocks (or cell areas) are simultaneously selected, only single local selection signal driver LYDa or LYDb needs to be disposed in each conjunction area CJT between adjacent memory cell blocks in each memory bank. In contrast, in the embodiments illustrated in FIG. 9, since two adjacent sub-memory blocks (or cell areas) are always complementarily selected, two local selection signal drivers LYDa and LYDb need to be disposed at each conjunction area CJT between adjacent memory cell blocks in each memory bank.

Figure 12:
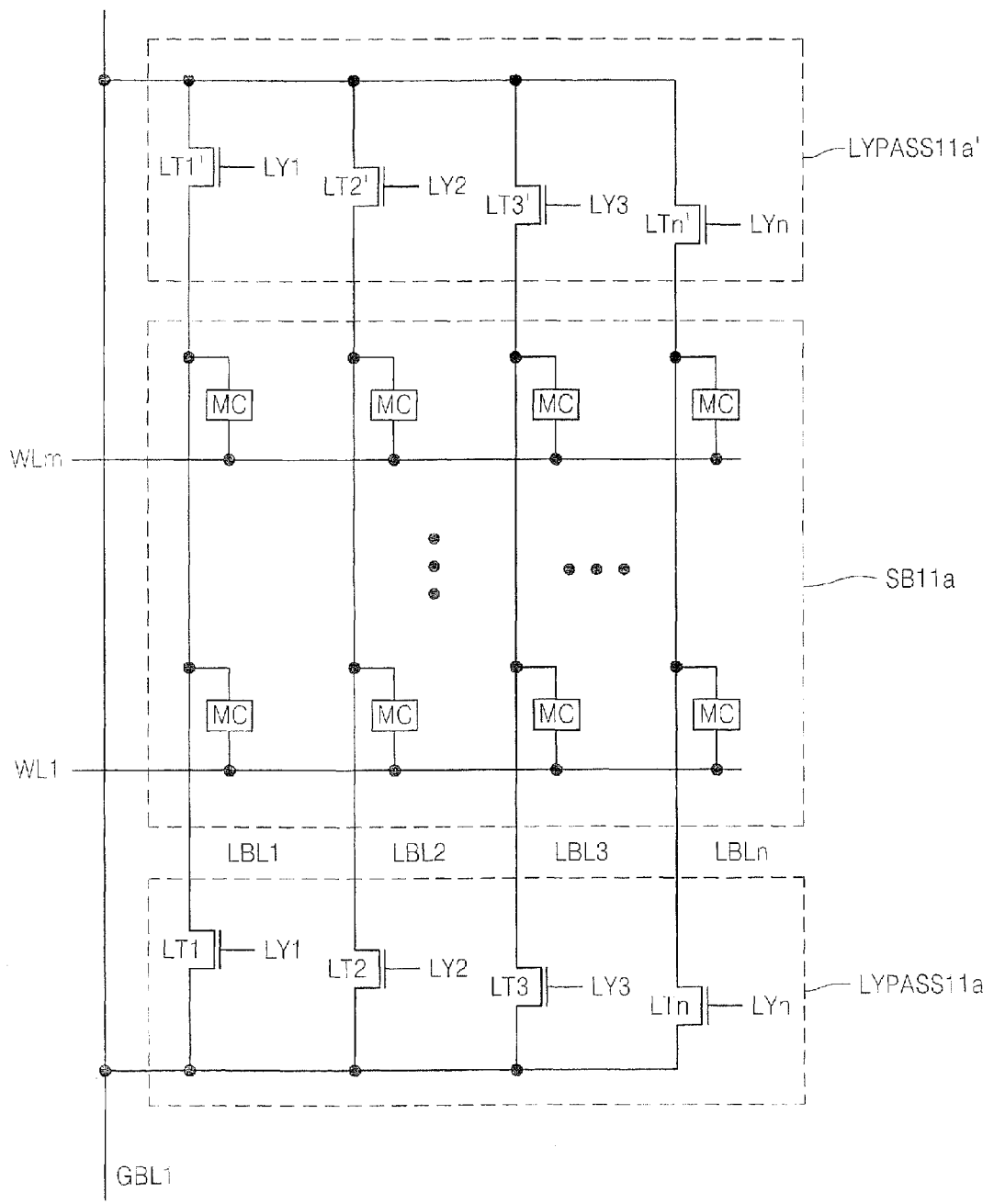
FIG. 12 illustrates a part of a structure of a sub-memory block and a local bit line selection circuit according to some embodiments of the present invention.
Figure 13:
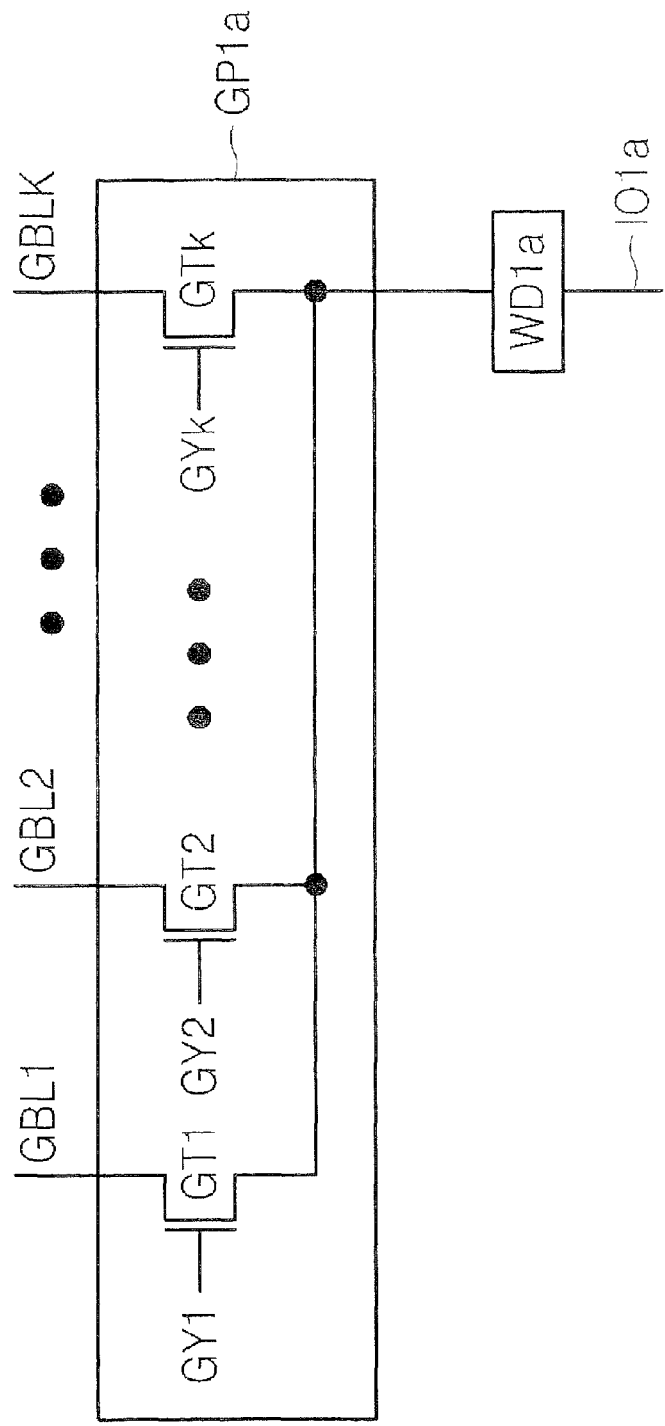
FIG. 13 illustrates a part of a structure of a global bit line selection circuit according to some embodiment of the present invention.

FIG. 12 illustrates a part of a structure of a sub-memory block and a local bit line selection circuit according to some embodiments of the present invention. FIG. 13 illustrates a part of a structure of a global bit line selection circuit according to some embodiment of the present invention.

A memory cell array illustrated in FIG. 12 includes a memory cell area SB11a corresponding to one global bit line GBL1 and local bit line selection circuits LYPASS11a' and LYPASS11a at the top and the bottom, respectively, of the memory cell area SB11a. The memory cell area SB11a may include a plurality of memory cells MC each of which is connected with a corresponding word line among a plurality of word lines WL1 through WLm (where "m" is a natural number) and a corresponding bit line among a plurality of local bit lines LBL1 through LBLn (where "n" is a natural number).

The local bit line selection circuit LYPASS11a at the bottom may include a plurality of NMOS transistors LT1 through LTn, each of which electrically connects a corresponding one of the local bit lines LBL1 through LBLn to the global bit line GBL1 in response to a corresponding local selection signal among a plurality of local selection signals LY1 through LY4. The local bit line selection circuit LYPASS11a' at the top may also include a plurality of NMOS transistors LT1' through LTn', each of which electrically connects a corresponding one of the local bit lines LBL1 through LBLn to the global bit line GBL1 in response to a corresponding one of the local selection signals LY1 through LY4. The local selection signals LY1 through LY4 are output from a first or second local selection signal driver.

Referring to FIG. 13, a global bit line selection circuit GP1a selects a global bit line in response to a global selection signal GYi (where i=1~k) provided from an address decoder (not shown). The global bit line selection circuit GP1a may include a plurality of NMOS transistors GT1 through GTk. The NMOS transistors GT1 through GTk selectively connect respective global bit lines GBL1 through GBLk to a data I/O line IO1a. For instance, when a global selection signal GY1 is enabled, the global bit line GBL1 is electrically connected to the data I/O line IO1a. A write driver WD1a provides a program current to a selected global bit line (e.g., GBL1) so that data can be written to a memory cell selected by the selected global bit line and a selected local bit line.

According to various embodiments of the present invention, in a semiconductor memory device having a global bit line shared by a plurality of memory banks, a plurality of memory banks can be simultaneously selected for multi-writing, so that data writing time and data writing time especially in a test mode can be reduced. In addition, conditions of a multi-write mode are the same as those of a normal write mode in the present invention, so that a test can be performed under the same conditions as the normal write mode.

While the present invention has been particularly shown and described with reference to exemplary embodiments thereof, it will be understood by those of ordinary skill in the art that various changes in forms and details may be made therein without departing from the spirit and scope of the present invention as defined by the following claims.

What is claimed is:

1. A semiconductor memory device comprising:
a data input/output line;
a plurality of memory banks each comprising a plurality of memory cells;
a first global bit line and a second global bit line which are connected to the plurality of memory banks; and
a first write driver and a second write driver which are connected with the data input/output line and provide a program current to the plurality of memory banks through the first and second global bit lines, respectively,
wherein each of the memory banks comprises:
a first cell area connected with the first global bit line; and
a second cell area connected with the second global bit line,
wherein in a normal write mode, either of the first or second cell areas is selected in one of the plurality of memory banks and data is written to a memory cell in the selected cell area, and
wherein in a multi-write mode, the first cell area in a first memory bank among the plurality of memory banks and the second cell area in a second memory bank among the plurality of memory banks are simultaneously selected and data is written to memory cells in the selected first and second cell areas,
the semiconductor memory device further comprising:
a plurality of first local bit lines connected with the first cell area and selectively connected with the first global bit line;
a plurality of second local bit lines connected with the second cell area and selectively connected with the second global bit line;
a first local selection circuit configured to select a local bit line in one of the first or second cell areas based on an address signal and a first area selection signal; and
a second local selection circuit configured to select a local bit line in the other of the first or second cell areas based on the address signal and a second area selection signal.

2. The semiconductor memory device of claim 1, wherein in the normal write mode, one of the first or second write drivers writes the data to the selected cell area through one of the first or second global bit lines, and
wherein in the multi-write mode, the first write driver writes the data to the first cell area through the first global bit line and simultaneously the second write driver writes the data to the second cell area through the second global bit line.

3. The semiconductor memory device of claim 2, wherein in the normal write mode, only one of the first or second write drivers is enabled, and
wherein in the multi-write mode, both the first and second write drivers are enabled.

4. The semiconductor memory device of claim 1, wherein each of the first and second local selection circuits comprises:
a local bit line selection circuit for a corresponding one of the first and second cell areas and configured to selectively connect a local bit line in the corresponding cell area to a corresponding global bit line in response to a local selection signal; and
a local selection signal driver configured to generate the local selection signal based on a signal obtained by decoding the address signal and a corresponding signal among the first and second area selection signals and to transmit the local selection signal to the local bit line selection circuit, and
wherein the first area selection signal and the second area selection signal respectively have complementary logic levels.

5. The semiconductor memory device of claim 1, wherein the multi-write mode is a test mode of the semiconductor memory device.

6. The semiconductor memory device of claim 1, wherein in the multi-write mode, the first area selection signal is activated, the first cell area in the first memory bank and the second cell area in the second memory bank are simultaneously selected, and data is written to the first and second cell areas, and then the second area selection signal is activated, a second cell area in the first memory bank and a first cell area in the second memory bank are simultaneously selected, and data is written to the second and first cell areas.

7. The semiconductor memory device of claim 1, wherein each of the plurality of memory banks comprises a plurality of memory blocks each of which comprises the first cell area and the second cell area.

8. The semiconductor memory device of claim 1, wherein each of the memory cells comprises a memory element having a phase-change material.

9. A semiconductor memory device comprising:
a plurality of data input/output lines;
a plurality of memory banks each comprising a plurality of memory cells;
a plurality of global bit lines connected to the plurality of memory banks; and
a first write driver and a second write driver which are provided per one of the plurality of data input/output lines,
wherein each of the memory banks comprises a plurality of memory blocks corresponding to a predetermined number of data input/output lines, respectively, among the plurality of data input/output lines,
wherein each of the memory blocks comprises a first cell area to which data is written by the first write driver and a second cell area to which data is written by the second write driver, and
wherein in a multi-write mode, a first memory bank and a second memory bank among the plurality of memory banks are simultaneously selected and one cell area among the first and second cell areas is selected with respect to a pair of the first and second write drivers in each of the first and second memory banks,
the semiconductor memory device further comprising:
a plurality of first local bit lines connected with the first cell area and selectively connected with one of the global bit lines;
a plurality of second local bit lines connected with the second cell area and selectively connected with another one of the global bit lines;
a first local selection circuit configured to select a local bit line in one of the first or second cell areas based on an address signal and a first area selection signal; and
a second local selection circuit configured to select a local bit line in the other of the first or second cell areas based on the address signal and a second area selection signal.

10. The semiconductor memory device of claim 9, wherein in the multi-write mode, the first cell area of each memory block in the first memory bank and the second cell area of each memory block in the second memory bank are simultaneously selected or the second cell area of each memory block in the first memory bank and the first cell area of each memory block in the second memory bank are simultaneously selected, and wherein in a normal write mode, only one memory bank among the plurality of memory banks is selected and the first or second cell area of each memory block is selected in the selected memory bank.

11. The semiconductor memory device of claim 10, wherein in the normal write mode, either of the first or second write drivers is enabled, and wherein in the multi-write mode, both of the first and second write drivers are enabled.

12. The semiconductor memory device of claim 9, wherein the first local selection circuit comprises:

a first local bit line selection circuit for a corresponding one of the first and second cell areas and configured to selectively connect a local bit line in the corresponding cell area to a corresponding global bit line in response to a first local selection signal; and a first local selection signal driver configured to generate the first local selection signal based on a signal obtained by decoding the address signal and the first area selection signal and to transmit the first local selection signal to the first local bit line selection circuit, wherein the second local selection circuit comprises:

a second local bit line selection circuit for a corresponding one of the first and second cell areas and configured to selectively connect a local bit line in the corresponding cell area to a corresponding global bit line in response to a second local selection signal; and a second local selection signal driver configured to generate the second local selection signal based on the signal obtained by decoding the address signal and the second area selection signal and to transmit the second local selection signal to the second local bit line selection circuit, and wherein the first area selection signal and the second area selection signal respectively have complementary logic levels.

13. The semiconductor memory device of claim 12, wherein each of the first and second cell areas belongs to one selection area among a first selection area selected based on the first area selection signal and a second selection area selected based on the second area selection signal.

14. The semiconductor memory device of claim 13, wherein the first and second local bit line selection circuits and the first and second local selection signal drivers are arranged to make two adjacent cell areas belong to different selection areas in the first and/or second memory banks.

15. The semiconductor memory device of claim 13, wherein the first and second local bit line selection circuits and the first and second local selection signal drivers are arranged to make two adjacent cell areas belong to the same selection area in the first and/or second memory banks.

16. The semiconductor memory device of claim 15, wherein the first or second local selection signal driver is shared by two cell areas belonging to the same selection area.

17. The semiconductor memory device of claim 15, wherein in the multi-write mode, the first area selection signal is activated, cell areas belonging to the first selection area are simultaneously selected, and data is written to the selected cell areas, and then the second area selection signal is activated, cell areas belonging to the second selection area are simultaneously selected, and data is written to the selected cell areas.

18. A semiconductor memory device comprising:

a data input/output line;

a plurality of memory banks each comprising a plurality of memory cells;

a first global bit line and a second global bit line, each one of which is connected to the plurality of memory banks; and a first write driver and a second write driver which are connected with the data input/output line and provide a program current to the plurality of memory banks through the first and second global bit lines, respectively, wherein each of the memory banks comprises:

a first cell area connected with the first global bit line; and a second cell area connected with the second global bit line, wherein in a normal write mode, either of the first or second cell areas is selected in one of the plurality of memory banks and data is written to a memory cell in the selected cell area, wherein in a multi-write mode, the first cell area in a first memory bank among the plurality of memory banks and the second cell area in a second memory bank among the plurality of memory banks that is different from the first memory bank are simultaneously selected and data is written to memory cells in both the selected first and second cell areas, wherein in the normal write mode, one of the first or second write drivers writes the data to the selected cell area through one of the first or second global bit lines, and wherein in the multi-write mode, the first write driver writes the data to the first cell area through the first global bit line and simultaneously the second write driver writes the data to the second cell area through the second global bit line.

19. The semiconductor memory device of claim 18, wherein in the normal write mode, only one of the first or second write drivers is enabled, and wherein in the multi-write mode, both the first and second write drivers are enabled.

20. The semiconductor memory device of claim 18, wherein each of the plurality of memory banks comprises a plurality of memory blocks each of which comprises the first cell area and the second cell area.

\* \* \* \* \*